United States Patent [19]

Effer

[11] 3,820,237

[45] June 28, 1974

[54] PROCESS FOR PACKAGING LIGHT EMITTING DEVICES

[75] Inventor: Dennis Effer, Ottawa, Ontario, Canada

[73] Assignee: Northern Electric Company Limited, Montreal, Quebec, Canada

[22] Filed: June 26, 1972

[21] Appl. No.: 265,983

Related U.S. Application Data

[62] Division of Ser. No. 144,012, May 17, 1971, abandoned.

[52] U.S. Cl. .................................... 29/588, 29/591

[51] Int. Cl. ............................................ B01j 17/00

[58] Field of Search ....... 29/576 S, 588, 569 L, 583; 317/591, 235 N

[56] References Cited

UNITED STATES PATENTS

| | | | |
|---|---|---|---|
| 3,281,606 | 10/1966 | Lueck | 317/235 N |
| 3,439,238 | 4/1969 | Birchler | 29/588 |
| 3,512,027 | 5/1970 | Kupsky | 317/235 N |
| 3,694,902 | 10/1972 | Apgan | 29/588 |

*Primary Examiner*—W. Tupman
*Attorney, Agent, or Firm*—Frank Turpin

[57] ABSTRACT

A package for a light emitting device is fabricated from a lead frame structure having a pair of electrodes. The end of one of the electrodes of the lead frame is shaped concavely to form a reflector having a predetermined shape. A semiconductor element is bonded to the interior surface of the reflector and electrically connected by a wire to one end of the other electrode. The ends of the two electrodes are mechanically secured together in spaced relationship by a transparent encapsulating substance which also forms the lens for the device.

7 Claims, 6 Drawing Figures

PROCESS FOR PACKAGING LIGHT EMITTING DEVICES

This application is a divisional of U.S. application Ser. No. 144,012, filed May 17, 1971, entitled: Package For Light Emitting Devices and now abandoned.

This invention relates to semiconductor light emitting devices and more particularly to a novel package for such devices.

Semiconductor light emitting diodes (LED's) have been known for many years and usually consist essentially of a p-n junction diode. The essential mechanism of light emission consists of injecting minority carriers through the junction. The resultant recombination energy is given off partly or wholly as light. If the semiconductor has a band gap between 1.7 and 3.26 electron volts, visible light is obtained. Semiconductor devices such as gallium arsenide with a band gap of 1.36 electron volts yield infrared radiation centered at 9,000 Angstroms.

LED's offer practical alternatives to existing hot filament light sources in many visual display applications and exhibit important advantages thereover. For example, some LED's consume less than one fortieth of the power tungsten filament bulbs currently used as indicator lamps on key telephones and other apparatus. An additional advantage of LED's is that a completely encapsulated semiconductor device is extremely resistant to vibrational shock. Also, the operating requirements of LED's are compatible with integrated circuits.

However, a major problem of semiconductor light emitting diodes is the limited amount of light available from any one device. The light intensity of a device may be increased appreciably by locating the semiconductor element of the device in a reflector so that the light radiated at the periphery of the p-n junction of the element is reflected towards an observer. Such reflectors can take many shapes and have been used in a number of devices.

For example, a light emitting device using a reflector is described in U.S. Pat. No. 3,513,027 to G. A. Kupsky. The device described in the Kupsky patent comprises a metal stem having a semiconductor element mounted on one end and a parabolic reflector surrounding the element and disposed coaxially with the stem. This device is representative of prior art devices in that it uses a coaxial type of package. This type of device is expensive to manufacture due in part to the complex manipulation and alignment of the piece parts involved in its assembly.

I have invented a new package for a light emitting device and a process for fabricating it utilizing commercially practicable techniques. My device incorporates all the desirable features of a semiconductor light emitting device in addition to being inexpensive to manufacture. Also, my device may be easily adapted for use in almost any application in the visual display field.

In accordance with my invention, I provide a device having a first electrode, one end of which is shaped concavely to form a reflector. The reflector end of the first electrode is disposed adjacent to and spaced from a first end of a second electrode. A major surface of a semiconductor element comprising a p-n junction is bonded to the interior surface of the reflector and the other major surface of the element is electrically connected to the first end of the second electrode by a conductive wire. A portion of the device is encapsulated in a transparent insulating substance so as to form a lens for the reflector and to mechanically secure the first ends of the electrodes in spaced relationship. The second ends of the electrodes provide terminals for connection to a source of power.

A device such as described above may be most advantageously fabricated using a lead frame. A lead frame is typically made from a thin strip of metal which is mechanically stamped or chemically etched to produce a repetitive pattern. Each pattern comprises a pair of electrodes having contiguous ends which are held adjacent each other and in spaced relationship by means of tie-bars. The lead frame principle permits devices to be fabricated as a continuous strip of packages thereby obviating the need for the manipulation and the alignment of the piece parts of the device.

Example embodiments of my invention will now be described in conjunction with the drawings in which.

Figure 1A:
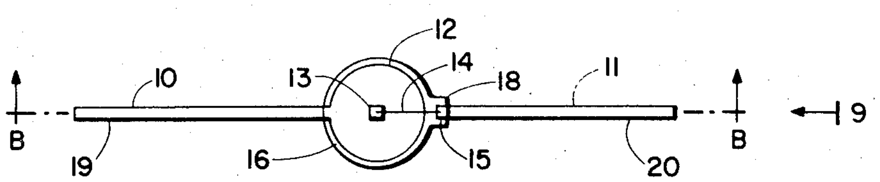
FIG. 1A is a plan view of a light emitting device incorporating a reflector in accordance with my invention.
Figure 1B:
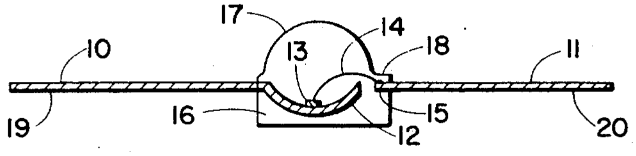
FIG. 1B is a cross-sectional side view of the device shown in FIG. 1A taken along the line B—B thereof.

FIGS. 1A and 1B illustrate a device 9 having a first electrode 10 and a second electrode 11. A first end of the electrode 10 is shaped concavely to form a reflector 12.

The device 9 includes a semiconductor element 13 comprising a p-n junction and having a pair of major surfaces coplanar with the junction. One of the major surfaces of the element 13 is bonded to the reflector 12. One end of a conductive wire 14 is bonded to the other major surface of the element 13 and its other end is bonded to a first end 15 of the second electrode 11 disposed adjacent to and spaced from the reflector 12.

A portion of the device 9 is encapsulated in a transparent insulating substance 16 to form a lens 17 for the reflector 12 while at the same time mechanically securing the reflector 12 and the end 15 of the electrode 11 in spaced relationship. The encapsulating substance 16 may be shaped to provide a shoulder 18 which may be used to identify which one of electrodes 10 and 11 is the anode and which one is the cathode of the device 9. The second ends 19 and 20 of electrodes 10 and 11 respectively provide terminals for connection to a source of power.

As discussed further below, the reflector 12 and the lens 17 may be of any desired shape and dimension suitable for the intended application of the device 9. In order to further increase the light emitting efficiency of the device, the interior surface of the device may be coated with a reflective material such as gold.

Figure 2:
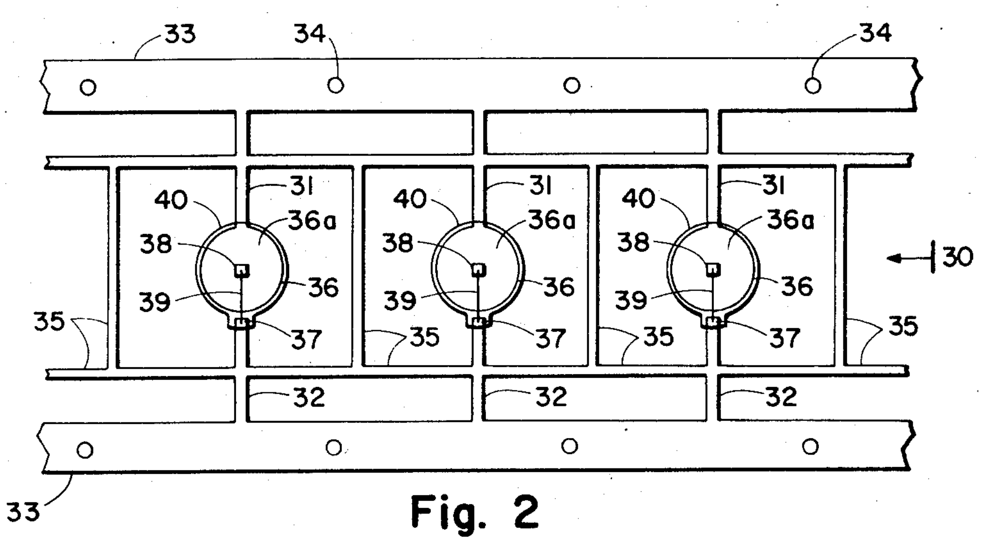
FIG. 2 illustrates a lead frame from which the device of FIG. 1A may be made.

As mentioned previously, a device as described above may be fabricated using a lead frame. FIG. 2 shows a portion of a lead frame 30 from which the device 9 of FIGS. 1A and 1B can be made. Typically, such a lead frame may be made from a thin strip of metal, for example Kovar, 1 inch wide and about ten thousandths of an inch thick.

Pairs of electrodes 31–32 are supported by primary tie-bars 33 which may be provided with sprocket holes 34 useful for the mechanization of the fabrication process. The contiguous ends of each pair of electrodes 31–32 are held rigidly in spaced relationship by secondary tie-bars 35. The end portion of electrodes 31 are shaped as flat circular pads 36. Of course, the dimension and shape of the pad 36 is dictated by the desired reflector.

In the preferred process of the invention, the pads 36 are die punched to form reflectors 36*a* having a concave interior surface and the electrodes 31 and 32 are then polished by agitating them in a warm chemical polishing solution. Such polishing solutions are well known in the art. For example, such a solution may be obtained by mixing together 80cc of glacial acetic acid, 20cc of concentrated mitric acid, and 0.5 of concentrated hydrochloric acid into which is melted 7.5 grams of sodium gluconate. The electrodes 31 and 32 may then be coated with a layer of reflective material. This may be achieved by electroplating the electrodes 31 and 32 in a solution of "bright" gold such as is commercially available for that purpose.

Although the entire surfaces of the electrodes may be polished and coated as described above, it is only necessary to polish and coat the interior surface of the reflector 36*a* and a surface of the end portion 37 of electrode 32 to which one end of a wire 39 will be bonded. This may be done simply by masking the surfaces not to be polished and coated.

Alternately, the lead frame may be coated before the die punching operation with a layer of gold approximately 3 microns thick. The surface of the gold may be granular rather than smooth in order to provide ends 37 of electrodes 32 with a surface ideally suited to wire bonding.

The pads 36 are then die punched to form reflectors 36*a* having a concave interior surface. The punching operation used to form the reflectors also polishes the interior surface of the reflector to a finish corresponding to the surface of the punch. For highly polished reflectors, a punch having a highly polished surface should therefore be used. As each reflector is punched, the gold flows to produce a smooth surface.

A major surface of a semiconductor element 38 may then be bonded to the interior surface of each reflector 36*a* using any standard method such as mechanical scrib bonding, ultrasonic bonding, alloying or metal-epoxy bonding. The first ends of conductive wires 39 are then wire bonded to the other major surfaces of elements 38, and their second ends bonded to the corresponding ends 37 of electrodes 32.

Each reflector 36*a* is then encapsulated in a transparent insulating substance 40 so as to form a lens therefor and to mechanically secure the reflector 36*a* to the corresponding end 37 of electrode 32 in spaced relationship. The shape of the lens will of course depend on the intended application of the device. The substance 40 may be an epoxy or silicone resin and the encapsulation may be formed by a transfer moulding operation.

The electrodes 31 and 32 may then be separated from the remainder of the lead frame 30 by severing them, using any well known method, from the primary tie-bars 33 and secondary tie-bars 35.

The process of the invention is especially adapted to the inexpensive production of devices having a multitude of applications. The shape of the reflectors may vary from hemispherical to paraboloidal to rectangular, resulting in devices having different angles of view and providing sources of light having different visual characteristics.

Figure 3A:
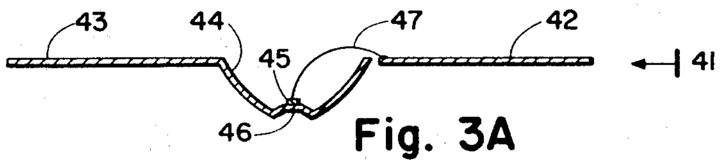
FIG. 3A is a cross-sectional side view of an alternate embodiment of the device shown in FIGS. 1A and 1B.

For example, FIG. 3A shows a device 41 having a pair of electrodes 42 and 43 one end of which is shaped to form a paraboloidal reflector 44 having a semiconductor element 45 mounted centrally therein. In order to enable the element 45 to be mounted in the reflector 44 so that the peripheral edge of the p-n junction of the element 45 is situated substantially at the focal point of the reflector 44, the latter is provided with a pedestal 46 which may be formed by the same die punching operation that resulted in the formation of reflector 44. A conductive wire 47 connects the element 45 to the electrode 42.

Figures 3B, 3C:
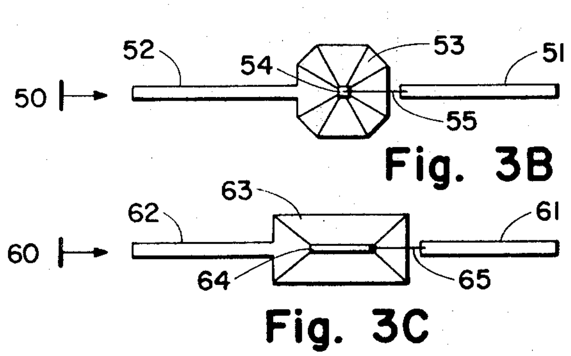
FIG. 3B is a plan view of another embodiment of the device shown in FIGS. 1A and 1B.
FIG. 3C is a plan view of yet another embodiment of the device shown in FIGS. 1A and 1B.

FIG. 3B illustrates a device 50 having a pair of electrodes 51 and 52 one end of which is shaped to form a reflector 53 having a polygonal peripheral and a segmented concavity. A semiconductor element 54 is mounted centrally in the reflector 53 and is connected to electrode 51 by a conductive wire 55. A device incorporating this type of reflector gives a scintillating or sparkling effect when it is emitting light.

FIG. 3C shows a further embodiment of a device which may be fabricated in accordance with the invention. There is shown a device 60 having electrodes 61 and 62, one end of which is shaped to form a reflector 63 having a rectangular periphery. A semiconductor element 64 is bonded to the reflector 63 and is connected to the electrode 61 by a conductive wire 65. A device incorporating this type of reflector is especially adapted for use in alpha-numeric displays. In some cases, it may be preferable to use a plurality of small semiconductor elements bonded to the same reflector rather than one large one.

None of the devices illustrated in FIGS. 3A, 3B, and 3C are shown as having an encapsulation. However, it should be understood that any device made in accordance with the invention must include an encapsulation such as described in relation with FIGS 1A, 1B and 2 since it functions as the mechanical bond between the two electrodes of the device.

As may be surmised from the above description, my invention permits the fabrication of inexpensive light emitting devices having almost any desired characteristics. Each of such devices exhibits the further advantage that the semiconductor element of the device is bonded to an electrode which functions both as a reflector and as a large heat sink, thereby enabling the semiconductor element to pass more current and resulting in a larger power output from the device.

What is claimed is:

1. A process for making a light emitting device using a lead frame having first and second electrodes, and also having tie-bars holding contiguous ends of said electrodes in spaced relationship, and a semiconductor element comprising a p-n junction and having a pair of major surfaces, comprising the steps of:

shaping said contiguous end of the first electrode into a concave reflector, bonding one of the major surfaces of the element to the interior surface of the reflector, bonding one end of a conductive wire to the other major surface of the element and the other end of the wire to a surface of said contiguous end of the second electrode, encapsulating a portion of the device with a transparent insulating substance so as to form a lens for the reflector and to mechanically secure the electrodes in spaced relationship, and severing the tie-bars from the electrodes.

2. A process as defined in claim 1 wherein the shaping of the reflector is done by die punching said contiguous end of the first electrode with a smooth surfaced punch to form a concave reflector having a shape corresponding to that of the punch.

3. A process as defined in claim 2, further comprising the step of coating at least the interior surface of the reflector and said surface of said contiguous end of the second electrode with a layer of gold before the semiconductor element is bonded to the interior surface of the reflector.

4. A process as defined in claim 3 wherein the coating is done by electroplating.

5. A process as defined in claim 4 wherein said surfaces are coated with a layer of bright gold after the die punching step and comprising the further step of polishing at least said surfaces before they are coated.

6. A process as defined in claim 5 wherein the polishing is done by agitating said surfaces in a warm chemical polishing solution.

7. A process as defined in claim 5 wherein said surfaces are coated before said contiguous end of the first electrode is die punched, whereby the interior surface of the reflector is polished to a finish corresponding to that of the surface of the punch by the punching operation.

* * * * *

UNITED STATES PATENT OFFICE
CERTIFICATE OF CORRECTION

Patent No. 3,820,237 Dated June 28, 1974.

Inventor(s) Dennis EFFER

It is certified that error appears in the above-identified patent and that said Letters Patent are hereby corrected as shown below:

Col. 3, line 34, change "Alternately" to --Alternatively--;

Col. 3, line 51, change "scrib" to --scrub--;

Col. 4, line 22, change "peripheral" to --periphery--;

Signed and sealed this 29th day of April 1975.

(SEAL)
Attest:

RUTH C. MASON
Attesting Officer

C. MARSHALL DANN
Commissioner of Patents
and Trademarks